United States Patent
Jin

(10) Patent No.: US 7,480,498 B2
(45) Date of Patent: Jan. 20, 2009

(54) RECEIVER GAIN CONTROL USING A PILOT SIGNAL

(75) Inventor: Hang Jin, Plano, TX (US)

(73) Assignee: Cisco Technology, Inc., San Jose, CA (US)

(*) Notice: Subject to any disclaimer, the term of this patent is extended or adjusted under 35 U.S.C. 154(b) by 395 days.

(21) Appl. No.: 11/203,261

(22) Filed: Aug. 12, 2005

(65) Prior Publication Data

US 2006/0068732 A1   Mar. 30, 2006

Related U.S. Application Data

(60) Provisional application No. 60/613,447, filed on Sep. 27, 2004.

(51) Int. Cl.
*H04B 1/06* (2006.01)

(52) U.S. Cl. .............. 455/232.1; 455/127.2; 455/247.1; 375/260; 375/345

(58) Field of Classification Search .............. 455/232.1
See application file for complete search history.

(56) References Cited

U.S. PATENT DOCUMENTS

| | | | |
|---|---|---|---|
| 5,204,976 A | 4/1993 | Baldwin et al. | 455/234.2 |
| 5,331,638 A | 7/1994 | Honkasaio et al. | 370/95.1 |
| 5,862,453 A | 1/1999 | Love et al. | 455/69 |
| 6,411,659 B1* | 6/2002 | Liu et al. | 375/326 |
| 6,563,891 B1 | 5/2003 | Eriksson et al. | 375/345 |
| 2003/0194029 A1* | 10/2003 | Heinonen et al. | 375/345 |
| 2004/0066802 A1 | 4/2004 | Ro et al. | 370/528 |
| 2004/0161046 A1* | 8/2004 | Schott et al. | 375/260 |
| 2004/0185808 A1* | 9/2004 | Chow | 455/127.2 |

* cited by examiner

*Primary Examiner*—Duc Nguyen
*Assistant Examiner*—Ajibola Akinyemi
(74) *Attorney, Agent, or Firm*—Edell, Shapiro & Finnan, LLC

(57) ABSTRACT

A method and system is disclosed for perform receiver gain control. A pilot signal is transmitted prior to each transmit period to facilitate an initial gain setting for a corresponding receiver period. This pilot signal has known properties and requires a much smaller receiver dynamic range than the rest of the traffic. An initial gain setting is derived based on the pilot signal received at a beginning of a corresponding receive period. A gain setting for traffic signals is then generated following the pilot signal in the receive period based on the initial gain setting.

19 Claims, 5 Drawing Sheets

RECEIVER GAIN CONTROL USING A PILOT SIGNAL

CROSS REFERENCE

The present application claims the benefits of U.S. Patent Provisional Application No. 60/613,447, entitled "Gain Controller for Receiver", which was filed on Sep. 27, 2004.

BACKGROUND

The present invention relates generally to a communication system design, and more particularly to a method and system for adjusting receiver gain and monitoring signal strength in telecommunication systems where the transmission and receive periods are interleaved.

A telecommunication system typically includes communication equipments on two ends of the communication link. For example, on one end, a base station is set up to communicate with, on another end, one or more mobile terminals traveling in a cell. Information is received and transmitted by both the base station and the mobile terminals. Both the base station and the mobile terminal have radio receiver circuitries that process incoming signals. Managing the signal gain is an important aspect of the function of these receiver circuitries.

In many radio receivers, a gain controller circuit is used to control the input signal to the receiver, because the input signal strength typically varies dramatically due to the change of environment or the signal characteristics. For example, the input signal strength can vary, due to a fading channel, more than 10 dB within a few milliseconds. Since a dynamic range of the receiver is limited, it cannot handle a wide dynamic range of input signal. Any signal beyond the dynamic range of the receiver circuit will be rejected as noise. A main purpose of installing a gain controller circuit on the receiver path is to reduce the gain of the receiver when the input signal strength is too high, and to increase the gain when the input signal strength is too low, so that the signal strength is kept almost at an optimized level within the receiver's achievable dynamic range.

Since the received signal strength varies rapidly, the gain control mechanism has to be dynamic as well to track the change thereof. In method is to let the gain controller continuously monitor the received signal strength (RSS) and adjust the receiver gain according to the most recent RSS value. However, this continuous RSS monitoring and gain adjustment is not possible for communication systems using Time Division Duplex (TDD) or half duplex Frequency Division Duplex (FDD) technologies where time slots for receive and transmit are interleaved.

In a typical TDD or half duplex FDD communication system, radio channels are divided by code sequences and time periods, but information transmitted and received are carried on the same frequency. Separate time slots are assigned for transmit and receive, and multiple time slots may be assigned to allow different data transmission rates for the downlink and uplink communications.

For the initial gain setting of each receive period in TDD systems, one has to rely on the outdated RSS value of the last receive period. This will result in an inaccurate initial gain setting since there could be a major difference between the RSS values of two receive periods as they are separated in time, especially when there is a fast channel fading. In other words, if the RSS of the last receive period is relied on, there is a high possibility that the received signal is out of the receiver dynamic range at the beginning of each receive period in TDD systems, thereby resulting in a high packet error rate. For example, assuming that a 10 ms TDD frame has 5 ms for receive and 5 ms for transmit, the distance change in 5 ms, given a traveling speed of 60 km/h, will be approximately 0.14 m, which is more than 1 wavelength in distance (0.12 m) in the 2.6 GHz band, and is thus beyond the coherent distance of a fading channel.

For these reasons, it is desirable to design a new method and system for minimizing the discontinuity effect of the received signal strength monitoring and for adjusting receiver gain in TDD systems more accurately for establishing better communication quality of the telecommunication system.

SUMMARY

In view of the foregoing, this invention provides a method and system for adjusting receiver gain in a telecommunication system wherein transmit periods are interleaved with their corresponding receive periods.

In one embodiment, a pilot signal is transmitted prior to each transmit period to facilitate the initial receiver gain setting for a corresponding receive period. This pilot signal has known properties and requires a much smaller receiver dynamic range than the rest of the traffic. An initial gain setting is derived based on the pilot signal received at the beginning of a corresponding receive period. A gain setting for traffic signals is then generated following the pilot signal in the receive period based on the initial gain setting.

The construction and method of operation of the invention, however, together with additional objects and advantages thereof will be best understood from the following description of specific embodiments when read in connection with the accompanying drawings.

DESCRIPTION

The present disclosure provides a method and system for adjusting receiver gain in a telecommunication system, wherein transmit periods are interleaved with their corresponding receive periods such as TDD systems or half duplex FDD systems. The examples illustrated below may use TDD systems for explaining the details of the invention, but it is clearly understood that the invention is not limited to TDD systems only.

Figure 1:
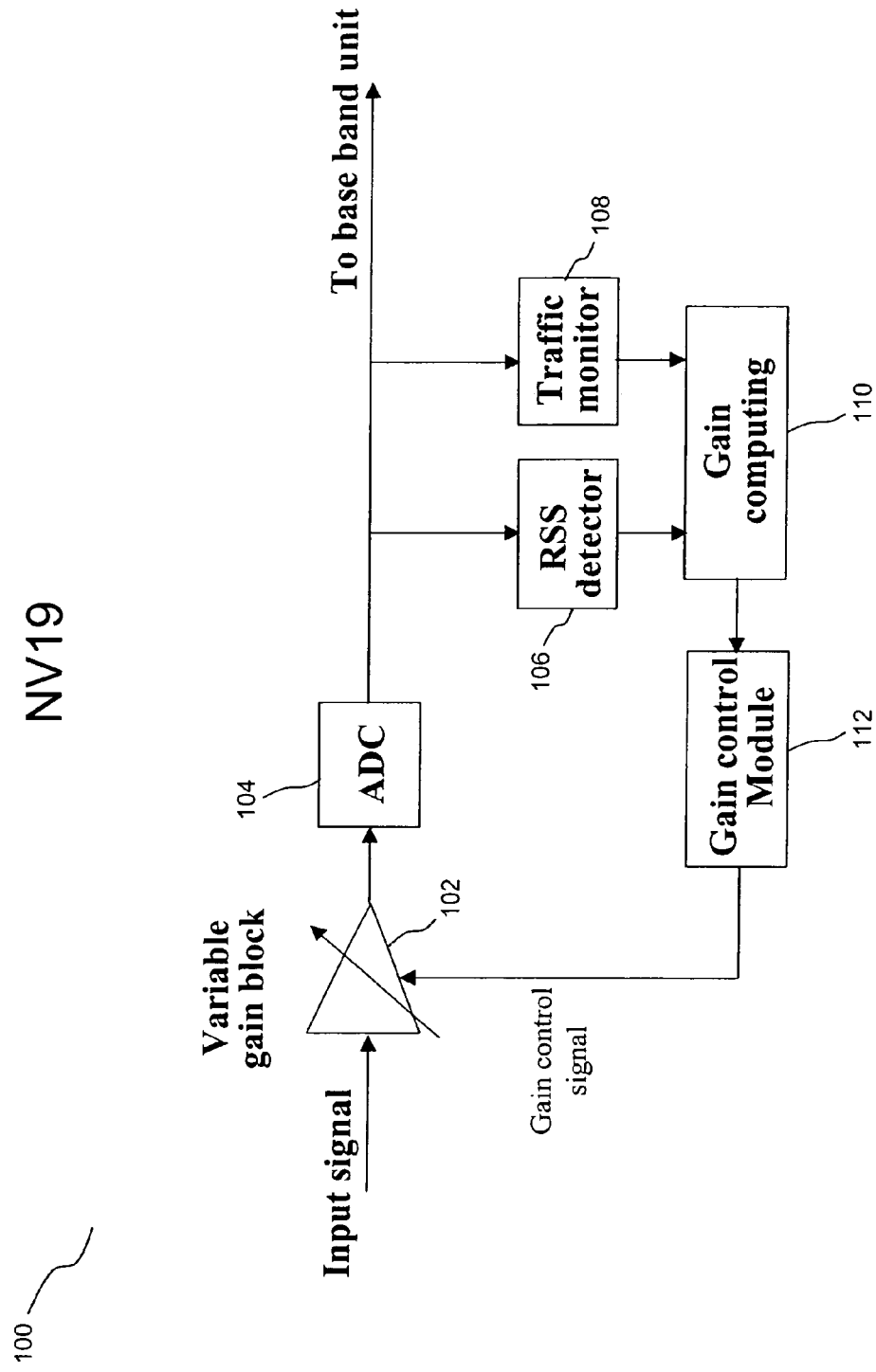
FIG. 1 illustrates a conventional gain controller for a receiver in a TDD system.

FIG. 1 illustrates a gain controller 100 for a receiver circuit in a TDD system. The gain controller 100 is comprised of a variable gain block 102, an analog-to-digital converter (ADC) block 104, a RSS detector block 106, a traffic monitor block 108, a gain computing block 110, and a gain control module 112.

Input signals are designed to enter the conventional gain controller 100 through the variable gain block 102, which controls the input signal strength. The gain of the variable gain block 102 is controlled by a gain control signal supplied by the gain control module 112. The output signal of the variable gain block 102 is then converted from an analog signal to a digital signal by the ADC block 104. The RSS detector block 106, the traffic monitor block 108, the gain computing block 110, and the gain control module 112 together form a feedback loop for adjusting the gain control signal that controls the variable gain block 102. The RSS detector block 106 is designed to detect the real-time instantaneous receive signal strength. The detected signal strength is used for the subsequent receiver gain computation. The traffic monitor block 108 belongs to the function blocks that are part of the higher layers of the communication protocol. It is designed to monitor the current traffic profile and to send signals to the gain computing block 110 for the computation of a reference RSS.

With both signals from the RSS detector block 106 and the traffic monitor block 108, the gain computing block 110 is designed to compute the moving average RSS, the reference RSS, and the gain setting value. When the RSS is higher than the reference RSS, it reduces the receiver gain; when the RSS is lower than the reference RSS, it increases the receiver gain. The gain control module 112 is a gain setting circuit where it converts the digital gain value from the gain computing block 110 into a gain control signal and applies it to the variable gain block 102. By controlling the variable gain block 102, the future input signal strength is adjusted and the signal outputting to the base-band unit is also affected accordingly.

Figure 2A:
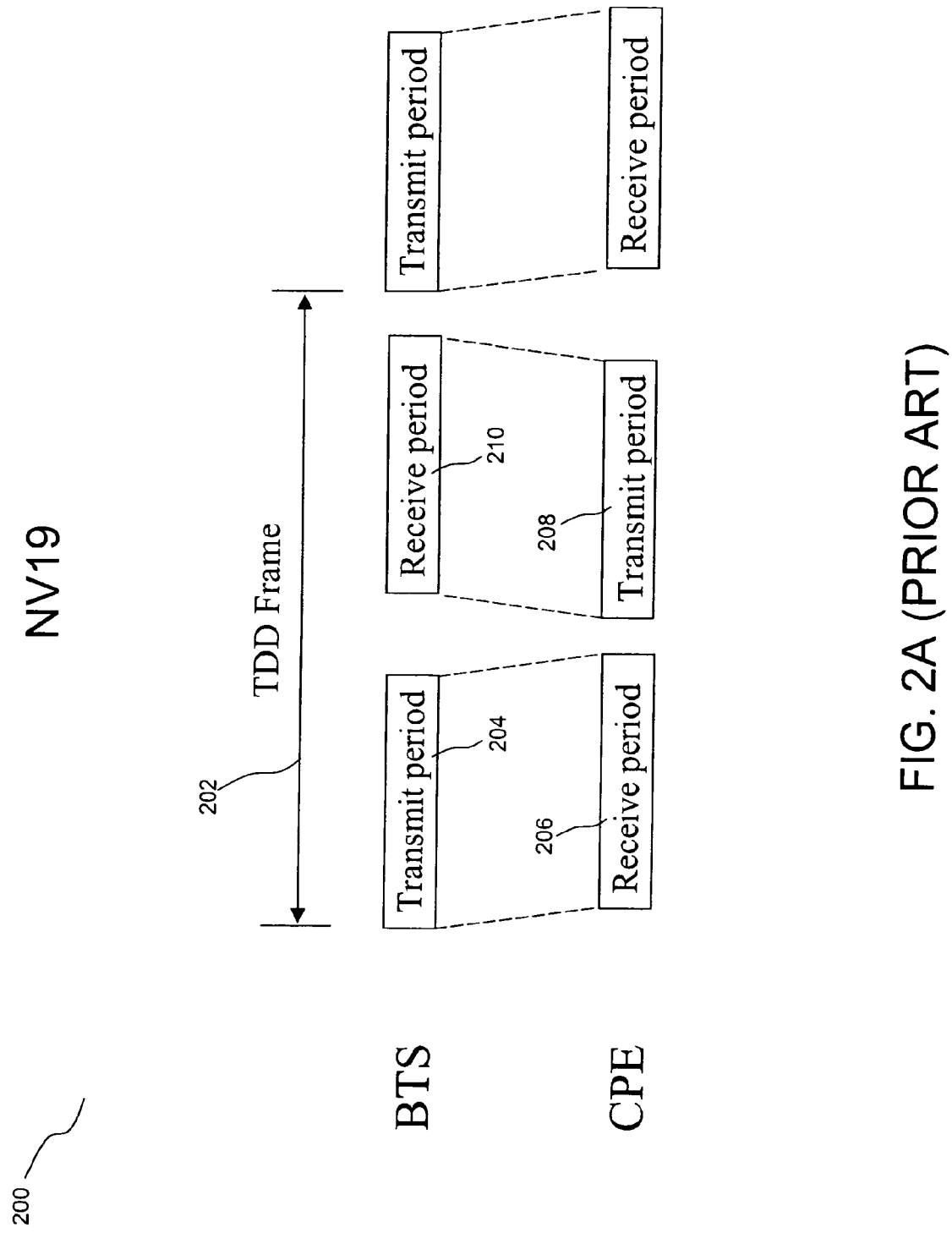
FIG. 2A illustrates a timing diagram of the transmitting and receiving periods of a conventional TDD frame.

FIG. 2A illustrates a diagram 200 of the transmit and receive periods of a conventional TDD frame 202 of a TDD system where the transmit and receive periods are interleaved. In a TDD system, a number of TDD frames are used for communication on the same frequency where each TDD frame, such as the TDD frame 202, includes a transmit period 204 for a base transceiver station (BTS), a receive period 206 for a customer premise equipment (CPE), a transmit period 208 for the CPE, and a receive period 210 for the BTS. As illustrated, since the transmit periods and the receive periods are interleaved in time, the continuous RSS monitoring and gain adjustment are not possible. For initial gain setting of each receive period, one has to rely on the RSS value of the last receive period, which may be outdated, thereby resulting in a high packet error rate.

Figure 2B:
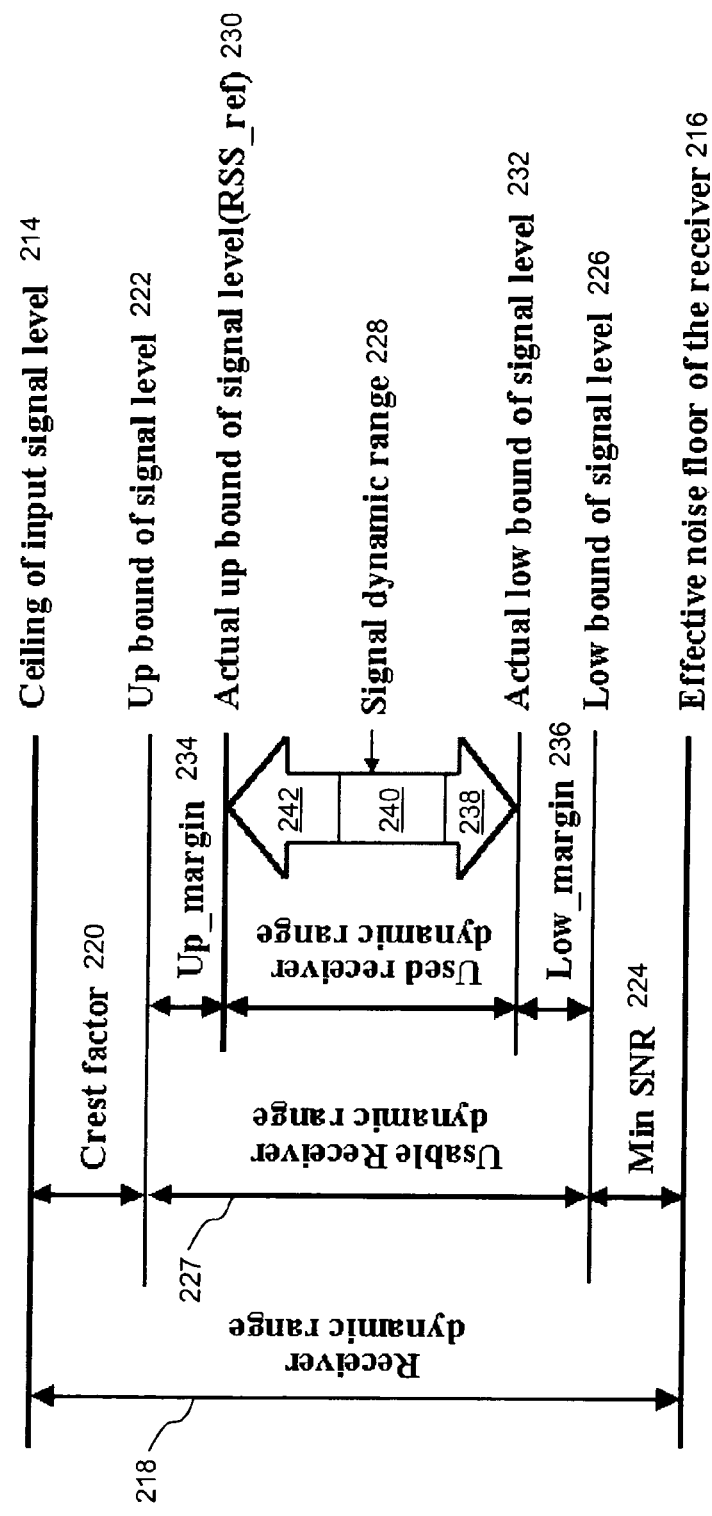
FIG. 2B illustrates a diagram showing the dynamic range of a conventional receiver.

FIG. 2B illustrates a diagram 212 showing the dynamic range of a receiver. The diagram 212 further shows that there is a ceiling of the input signal level 214 and an effective noise floor 216 where their difference determines a receiver dynamic range 218. Signals beyond this receiver dynamic range are not considered.

The ceiling of the input signal level 214 is often characterized as the receiver P1 dB. The effective noise floor 216 is the noise floor that is seen by the base band unit where the signal quality, like Bit Error Rate (BER) or Forward Error Rate (FER), is computed. In TDD/Code Division Multiple Access (CDMA) telecommunication systems, an effective noise floor will be the ambient thermal noise floor, plus the receiver noise figure, minus the CDMA spread gain:

Effective noise floor=$-174+NF-10*\log 10(SF)$(dBm/Hz)

where SF is the spread factor of CDMA.

Not all the receiver dynamic range 218 is usable. For a digital modulated signal, a buffer space or headroom is needed at the top of the dynamic range for the signal peaks, which is also known as a crest factor 220. The crest factor 220, ranging between the ceiling of input signal level 214 and an up-bound of signal level 222, provides the traffic profile containing information regarding modulation, number of channels, coding, and etc. Typically, when a digital modulated signal appears peaky, its peak-to-mean ratio is characterized with a complementary cumulation distribution function (CCDF) curve. Depending on the communication channel quality requirement, one could select a point on the signal peak-to-mean CCDF curve as the crest factor 220 of the signal. For example, one could choose 0.1% as the criteria, and the peak-to-mean value on the CCDF curve that corresponds to 0.1% will be the crest factor 220 of the signal.

Furthermore, a minimum signal-to-noise ratio (SNR) 224 at the bottom of the dynamic range is required to maintain the signal quality. The minimum SNR 224, ranging between the effective noise floor 216 and a low-bound of signal level 226, is determined depending on the traffic profile. For example, for quadrature phase-shift keying (QPSK) modulation, the minimum SNR 224 needed is about 10 dB. When using a modulation technique such as 64-bit quadrature ampliture modulation (64 QAM), a better SNR may be needed to overcome any interference and to maintain a certain bit error ratio (BER). For example, a minimum of 23 dB is needed for the minimum SNR 224 when using the 64 QAM. Therefore, a usable actual receiver dynamic range 227 is smaller than the theoretical receiver dynamic range 218. In short, the usable receiver dynamic range 227 is determined by excluding the crest factor 220 and the minimum SNR 224 from the two ends of the receiver dynamic range 218.

Moreover, a signal using multiple channels also has a dynamic range itself, which can be referred to as a signal dynamic range 228. The signal dynamic range 228 is defined as the difference between the total received power and the least power of one channel which is represented by an actual low-bound of signal level 232. For example, assume a TDD/CDMA signal contains three channels, one channel uses QPSK with 10 dB SNR, one uses 16 QAM with 17 dB SNR, and one uses 64 QAM with 23 dB SNR. Here, all SNRs are given with respect to a hypothesis common reference level. The total power of the three channels will be 24 dB, while the least power of one channel is 10 dB, which is the power of the QPSK channel. Therefore, the signal dynamic range 228 will be 14 dB (=24 dB−10 dB). When all channels in a signal use the same type of modulation, the signal dynamic range can be readily calculated as: $10*\log 10(N\_ch)$, where N_ch is the number of channels.

For normal operation, a signal dynamic range 228 should be defined narrower than the usable dynamic range 227 of the receiver. Thus, one could have some extra margins, an up margin 234 and a low margin 236 for the signal fluctuations and the imperfection of receiver gain control. Given the dynamic range of the receiver, the up margin 234 and low margin 236 allowed should be determined depending on the signal dynamic range 228. A signal with less dynamic range will have a larger up margin 234 and low margin 236, and a signal with high dynamic range will have less up margin 234 and low margin 236. It is also understood that the signal dynamic range 228 can contain multiple channels with different configurations. In this example, the signal dynamic range 228 contains three channels: a channel 238 for QPSK, a channel 240 for 16 QAM, and a channel 242 for 64 QAM.

Figure 3:
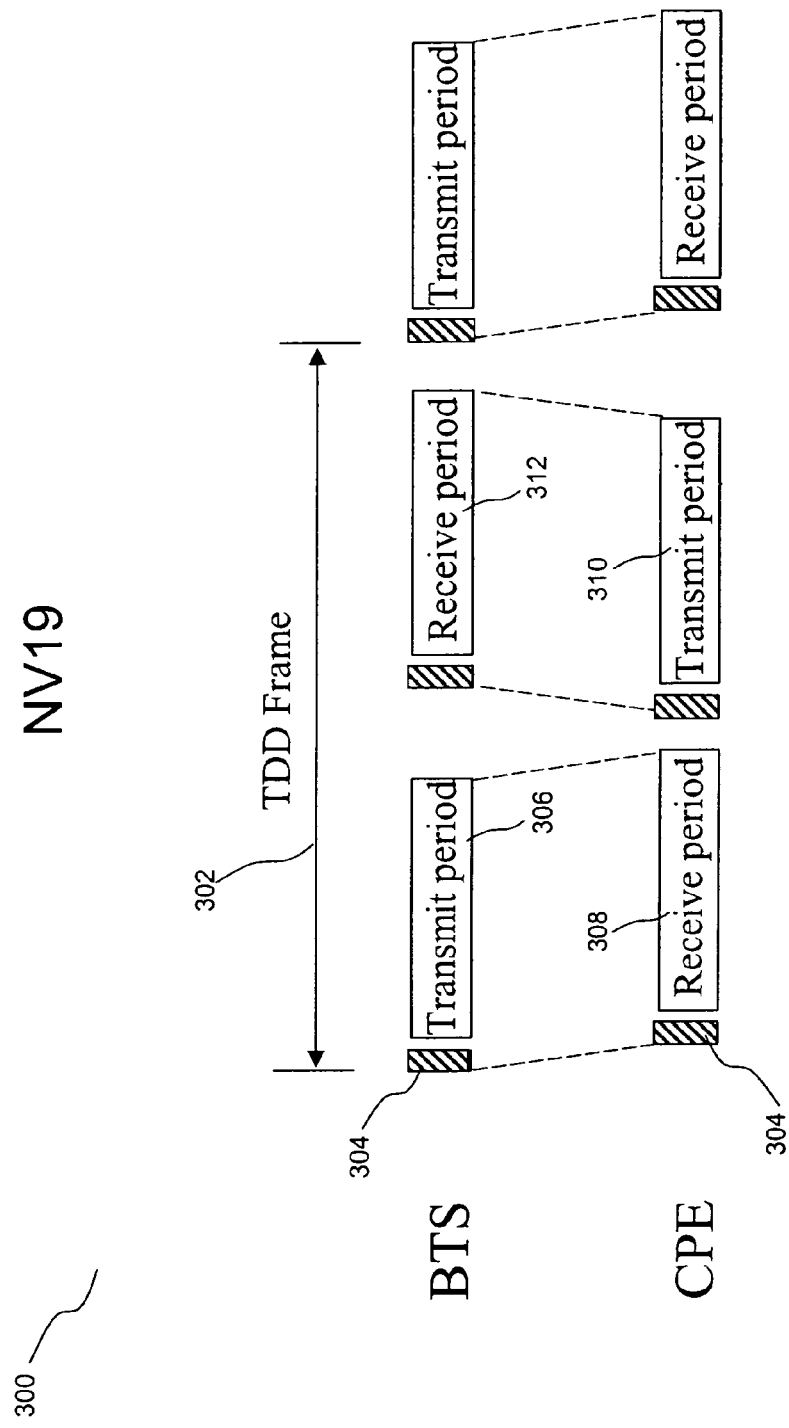
FIG. 3 illustrates a timing diagram of the transmitting and receiving periods of a TDD frame in accordance with one embodiment of the present invention.

FIG. 3 illustrates a diagram 300 of the transmit and receive periods of a TDD frame 302 in accordance with one embodiment of the present invention. Unlike the conventional TDD frame 202, the TDD frame 302 is implemented with a number of pilot signals 304. The pilot signals are transmitted by a transmitter circuit either in the base station or the mobile terminals. The pilot signals can also be predetermined by the base station and assigned to the mobile terminals. Other than the pilot signals, the TDD frames in accordance with one embodiment of the present invention has the similar configuration, that is, a transmit period 306 for a BTS, a receive period 308 for a CPE, a transmit period 310 for the CPE, and a receive period 312 for the BTS.

In order to facilitate the initial gain setting for each receive period, a pilot signal 304 is transmitted in front of each transmit period. Since it is a pilot signal whose configuration can be pre-controlled, the pilot signal 304 can have fixed and known properties and requires much smaller dynamic range than the normal traffic. For example, the pilot signal could be a single channel with QPSK modulation, and a signal comprised of a single channel has 0 dB dynamic range theoretically. It is evident that a pilot signal with a much less dynamic range can have a larger up margin and a low margin, and have a better chance to fall within the receiver dynamic range of the receiver even if the gain is determined based on the outdated RSS value obtained in the previous receive period.

For the initial gain setting for the pilot signal, since the pilot signal precedes each receive period, one has to rely on the RSS value, which determines the receiver gain, of the last receive period. Assuming that the most recent gain setting used in the last receive period is G0, the initial gain setting Gp, which can be viewed as an adjustment value, for the pilot signal for the current receive period can be written as:

$$Gp = G0 + \Delta Gp$$

$$\Delta Gp = \Delta Gp_A + \Delta Gp_B \quad \text{(Equation 1)}$$

where $\Delta Gp_A$ is the gain adjustment resulting from the difference between the reference RSSs for the pilot and the traffic signals, and $\Delta Gp_B$ is the gain adjustment resulting from the profile difference between the pilot signal and normal traffic signals of the last receive period.

Assume that the reference RSS for the pilot signal is set in such a way that the pilot signal sits in the middle of the receiver dynamic range and has the same low margin and up margin, $\Delta Gp_A$ is given by:

$$\Delta Gp_A = (DR\_rx - \text{crest\_factor} - SNR\_p)/2 + 5\log 10(N\_p) - RSS\_ref0$$

where DR_rx is the receiver dynamic range in dB, crest_factor is the crest factor of the pilot signal in dB, and SNR_p is the minimum SNR required for the pilot signal in dB. For QPSK modulation, SNR_p can be set as 10 dB. N_p is the number of channels contained in the pilot signal. RSS_ref0 is the most recent reference RSS value used in the last receive period.

$\Delta Gp_B$ is given by:

$$\Delta Gp_B = SNR\_p - SNR\_min0 + 10*\log 10(N\_p) - 10*\log 10(N\_ch0)$$

where SNR_min0 is the SNR required for the traffic signals, N_ch0 is the number of channels contained in the traffic.

The gain setting for the pilot signal given by Equation 1 is based on the heuristics of the RSS in the last receive period, plus the profile difference between the pilot signal and the normal traffic signals in the last receive period. It would set the operation point of the pilot signal in the middle of the receiver dynamic range if the receive periods were continuous and there was no time gap in-between, i.e. no transmit period and guard times imposed. However, since there is always a time delay in TDD systems, and the signal strength will change from time to time, the actual RSS of the pilot signal will inevitably deviate from the desired operation point. Since it is designed to have a small dynamic range (e.g., in the case of a single channel, the signal dynamic range is 0 dB), which allows the pilot signal to have a better chance of falling within the receiver dynamic range even under severe channel fading conditions. For example, if the receiver has a 20 dB usable dynamic range, and the pilot signal contains a single channel operating in the middle of the receiver dynamic range, one could handle ±10 dB channel variation from frame to frame.

Once the pilot channel is used for initial gain setting, the subsequent gain setting for the normal traffic can be performed with a smooth transition, represented by the following:

$$G1 = Gp + \Delta G1$$

$$\Delta G1 = \Delta G1_A + \Delta G1_B \quad \text{(Equation 2)}$$

where Gp is the current gain derived based on the pilot signal that is generated by Equation 1. $\Delta G1$ includes two parts: $\Delta G1_A$ is the gain adjustment resulting from the difference between the actual RSS of the pilot signal and the desired reference RSS for traffic signals, and $\Delta G1_B$ is the gain adjustment resulting from the traffic profile difference between the pilot signal and normal traffic signals. $\Delta G1_A$, furthermore, is given by:

$$\Delta G1_A = RSS\_ref1 - RSS\_p$$

where RSS_ref1 is the desired reference RSS for the traffic and RSS_p is the actual received signal strength for the pilot signal.

$\Delta G1_B$, the gain adjustment resulting from the traffic profile difference between pilot signal and normal traffic signals in the current period, can be derived by:

$$\Delta G1_B = SNR\_p - SNR\_min1 + 10*\log 10(N\_p) - 10*\log 10(N\_ch1)$$

where SNR_p and SNR_min1 are, respectively, the minimum SNR required for pilot signal and traffic. N_ch1 is the number of channels of traffic in the current receive period.

After the gain is set for the beginning of the normal traffic, the RSS monitoring and gain adjustment for the rest of the traffic in the current receive period will be continuous. Therefore, any automatic gain control (AGC) adjustment procedure suitable for the case of continuously receiving, such as in frequency division duplex (FDD) receiver, can be used as well.

It is also understood that in addition to setting the receiver gain, the pilot signal 304 can be used simultaneously for other purposes, including system timing/frequency acquisition, carrying message, etc.

Figure 4:
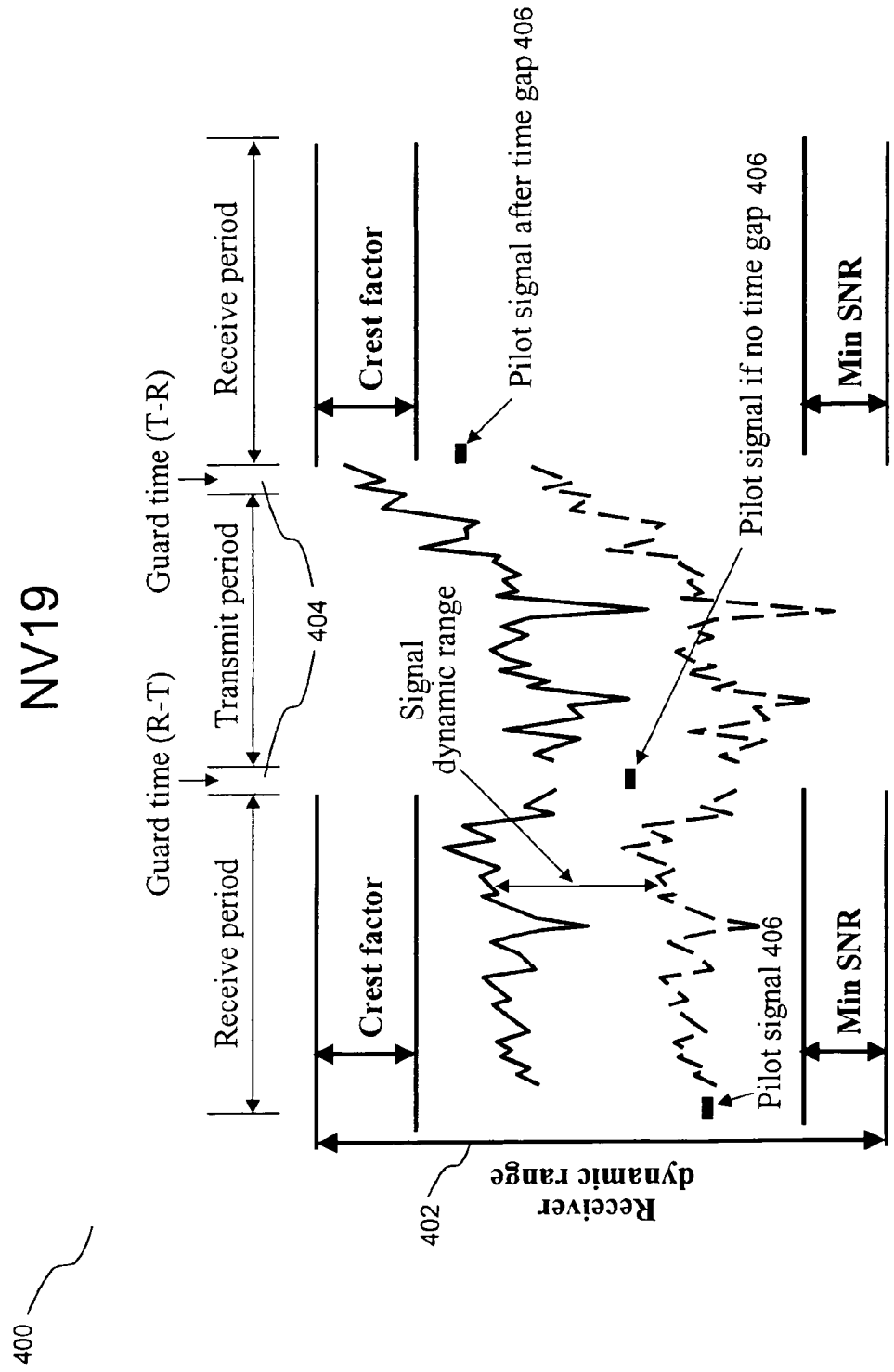
FIG. 4 illustrates a diagram showing the dynamic range of a receiver with a TDD frame having pilot signals in accordance with one embodiment of the present invention.

FIG. 4 illustrates a diagram 400 showing the dynamic range of a receiver with a TDD frame having pilot signals used before each receive period in accordance with one embodiment of the present invention. The two signal lines within a receiver dynamic range 402 represents a signal received by a base station and a signal received by a mobile terminal. There is a guard time period 404 in between a receive period and a transmit period. The guard time is normally used for adjusting the time delay caused by the distance between the mobile terminal and the base station. During this guard time period 404, pilot signals 406 can be inserted.

As it is shown, the pilot signals 406 have known properties and precedes each receiver period and it is most likely to fall within the receiver dynamic range even though there is a TDD frame discontinuity in RSS monitoring. The pilot signal guides the gain adjustment for the receive period and avoids the overflow or underflow of the signal at the beginning of each receive period.

In summary, the method and system described in this disclosure provides a TDD frame with at least a pilot signal that is applied for each new receive period. Since it is continuous with the following traffic signals within the same receive period, the gain estimation is more accurate. The gain control can be done on the base station side as well as the mobile terminal side as long as there is a receiver circuit.

The above illustration provides many different embodiments or embodiments for implementing different features of the invention. Specific embodiments of components and processes are described to help clarify the invention. These are, of course, merely embodiments and are not intended to limit the invention from that described in the claims. It is understood that the above description uses a TDD system as a specific example, any other system that has two discontinuous receive periods can use the current method to get a better gain control.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for adjusting a gain setting in a telecommunication system comprising:
   at a first device, generating a pilot signal that has a dynamic range much smaller than a dynamic range associated with traffic signals to be transmitted from the first device to a second device;
   transmitting the pilot signal from the first device to the second device preceding each transmit period during which traffic signals are transmitted from the first device to the second device;
   receiving the pilot signal at the second device prior to a receive period that corresponds to the transmit period and during which receive period the second device receives traffic that is transmitted from the first device;
   deriving an initial gain setting associated with a receiver at the second device based on the pilot signal and on the basis of a gain setting computed at a most recent receive period, a first gain adjustment representing a difference between a desired reference received signal strength (RSS) of the pilot signal and a desired reference RSS of the traffic signals, and a second gain adjustment representing a profile difference between the pilot signal and the traffic signals of the most recent receive period; and
   generating a gain setting for use by the receiver when receiving the traffic signals based on the initial gain setting.

2. The method of claim 1, wherein the pilot signal is a single channel signal with a quadrature phase-shift keying modulation.

3. The method of claim 1, wherein the pilot signal is a single channel signal with 64-bit quadrature amplitude modulation.

4. The method of claim 1, wherein transmitting comprises transmitting the pilot signal during a guard time preceding the transmit period.

5. The method of claim 1, wherein deriving comprises deriving the initial gain setting based further on an RSS value of the pilot signal associated with a previous receive period.

6. The method of claim 1, and further comprising computing the first gain adjustment as a function of at least a dynamic range of the receiver, a crest factor of the pilot signal, and a minimum signal-to-noise ratio required for the pilot signal.

7. The method of claim 1, and further comprising computing the second gain adjustment as a function of a signal-to-noise ratio required for the traffic signals and a predetermined number of channels used for the traffic signals.

8. The method of claim 6, wherein computing the first gain adjustment comprises computing $(DR\_rx - crest\_factor - SNR\_p)/2 + 5\log 10(N\_p) - RSS\_ref0$, where $DR\_rx$ is the dynamic range in dB of the receiver at the second device, $crest\_factor$ is the crest factor of the pilot signal in dB, $SNR\_p$ is the minimum signal-to-noise ratio in dB required for the pilot signal, $N\_p$ is the number of channels associated with the pilot signal, and $RSS\_ref0$ is the reference RSS value used in the most recent receive period.

9. The method of claim 8, wherein computing the second gain adjustment comprises computing $SNR\_p - SNR\_min0 + 10*\log 10(N\_p) - 10*\log 10(N\_ch0)$, where $SNR\_min0$ is the minimum signal-to-noise ratio required for the traffic signals, $N\_p$ is the number of channels associated with the pilot signal and $N\_ch0$ is the number of channels contained in the traffic signals.

10. The method of claim 1, wherein generating the gain setting further comprises deriving an adjustment value based on a first adjustment value representing a difference between an actual RSS of the pilot signal and the desired reference RSS for the traffic signals, and a second adjustment value representing a profile difference between the pilot signal and the traffic signals.

11. The method of claim 10, and further comprising computing the second adjustment value as a function of a minimum signal-to-noise ratio required for the pilot signal and the traffic signals, and a predetermined number of channels used in the receive period.

12. The method of claim 11, wherein computing the second adjustment value comprises computing $SNR\_p - SNR\_min1 + 10*\log 10(N\_p) - 10*\log 10(N\_ch1)$, where $SNR\_p$ is the minimum signal-to-noise ratio required for the pilot signal, $SNR\_min1$ is the minimum signal-to-noise ratio required for the traffic signals, $N\_p$ is the number of channels associated with the pilot signal and $N\_ch1$ is the number of channels of traffic signals in a current receive period.

13. A system comprising:
    a first device that comprises a transmitter circuit configured to transmit a pilot signal that has a dynamic range much smaller than a dynamic range associated with traffic signals, wherein the transmitter is configured to transmit the traffic signals during a transmit period and to transmit the pilot signals preceding each transmit period; and
    a second device that comprises a receiver circuit that is configured to receive the traffic signals during a receive period that corresponds to the transmit period and to receive the pilot signal prior to each receive period, wherein the second device is configured to derive an initial gain setting associated with the receiver circuit based on the pilot signal using a gain setting computed at a most recent receive period, a first gain adjustment representing a difference between a desired reference received signal strength (RSS) of the pilot signal and a desired reference RSS of traffic signals, and a second gain adjustment representing a profile difference between the pilot signal and the traffic signals associated with the most recent receive period, and wherein the second device is further configured to generate a gain setting when receiving traffic signals based on the initial gain setting.

14. The system of claim 13, wherein the second device is further configured to derive an adjustment value based on a first adjustment value representing a difference between an actual RSS of the pilot signal and the desired reference RSS for the traffic signals, and a second adjustment value representing a profile difference between the pilot signal and the traffic signals.

15. The system of claim 13, wherein the transmitter of the first device is configured to generate the pilot signal as a single channel signal with a quadrature phase-shift keying modulation.

16. The system of claim 13, wherein transmitter of the first device is configured to transmit the pilot signal during a guard time preceding the transmit period.

17. The system of claim 13, wherein the second device is further configured to compute the first again adjustment by computing $(DR\_rx-crest\_factor-SNR\_p)/2 + 5 \log 10(N\_p) - RSS\_ref0$, where $DR\_rx$ is the receiver dynamic range in dB, $crest\_factor$ is the crest factor of the pilot signal in dB, $SNR\_p$ is the minimum signal-to-noise ratio in dB required for the pilot signal, $N\_p$ is the number of channels associated with the pilot signal, and $RSS\_ref0$ is the reference RSS value used in the most recent receive period.

18. The system of claim 17, wherein the second device is further configured to compute the second gain adjustment by computing $SNR\_p - SNR\_min0 + 10*\log 10(N\_p) - 10*\log 10(N\_ch0)$, where $SNR\_min0$ is the minimum signal-to-noise ratio required for the traffic signals, $N\_p$ is the number of channels associated with the pilot signal and $N\_ch0$ is the number of channels contained in the traffic signals.

19. The system of claim 14, wherein the second device is further configured to compute the second adjustment value by computing $SNR\_p - SNR\_min1 + 10*\log 10(N\_p) - 10*\log 10(N\_ch1)$, where $SNR\_p$ is the minimum signal-to-noise ratio required for the pilot signal $SNR\_min1$ is the minimum signal-to-noise ratio required for the traffic signals, $N\_p$ is the number of channels associated with the pilot signal and $N\_ch1$ is the number of channels of traffic signals in a current receive period.

* * * * *